United States Patent [19]

Taylor

[11] Patent Number: 5,008,565

[45] Date of Patent: Apr. 16, 1991

[54] HIGH-IMPEDANCE FET CIRCUIT

[75] Inventor: Stewart S. Taylor, Beaverton, Oreg.

[73] Assignee: TriQuint Semiconductor, Inc., Beaverton, Oreg.

[21] Appl. No.: 468,507

[22] Filed: Jan. 23, 1990

[51] Int. Cl.$^5$ .................... H03K 3/01; H03K 3/353; G06G 7/10

[52] U.S. Cl. .................... 307/296.7; 307/304; 307/491

[58] Field of Search ............ 307/475, 571, 448, 450, 307/543–544, 552, 556, 558, 559, 570, 237, 581, 578, 270, 565, 491, 490, 304, 296.8, 296.7

[56] References Cited

U.S. PATENT DOCUMENTS

| | | | |
|---|---|---|---|
| 4,256,978 | 3/1981 | Pinckaers | 307/304 |
| 4,443,719 | 4/1984 | Planer et al. | 307/270 |
| 4,558,235 | 12/1985 | White et al. | 307/450 |
| 4,686,451 | 8/1987 | Li et al. | 307/296.8 |
| 4,707,625 | 11/1987 | Yanagisawa | 307/578 |
| 4,712,023 | 12/1987 | Otsuki et al. | 307/450 |
| 4,752,701 | 6/1988 | Gonoi | 307/559 |
| 4,804,866 | 2/1989 | Akiyama | 307/581 |
| 4,833,342 | 5/1989 | Kiryu et al. | 307/544 |

FOREIGN PATENT DOCUMENTS 0194414 8/1988 Japan ..................... 307/571

Primary Examiner—Stanley D. Miller
Assistant Examiner—Toan Tran
Attorney, Agent, or Firm—Alan T. McCollom; Peter J. Meza

[57] ABSTRACT

A high-impedance FET circuit in which the anode of a diode is electrically connected to the first side of the FET and the diode's cathode is connected to the FET gate. The diode biases the FET to reduce second side current when the second side is at a positive potential relative to the diode cathode. Such circuits placed back-to-back accommodate signals of both polarities and are used as a high impedance element in a low-pass filter implemented in an integrated circuit. An equivalent symmetrical circuit implemented with two enhancement FETs is also disclosed.

31 Claims, 2 Drawing Sheets

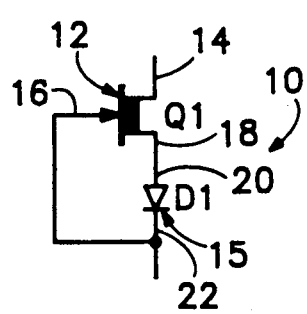
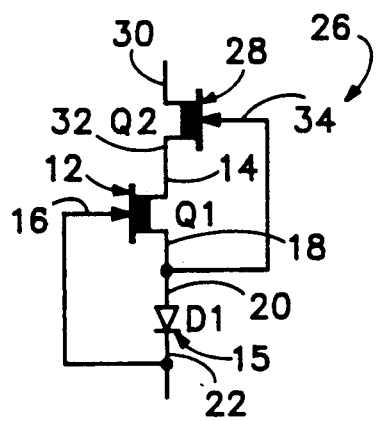
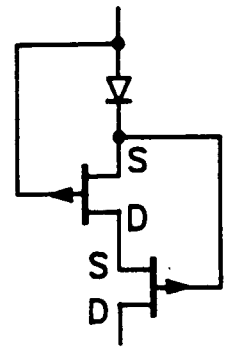
FIG.1　　FIG.2　　FIG.2A
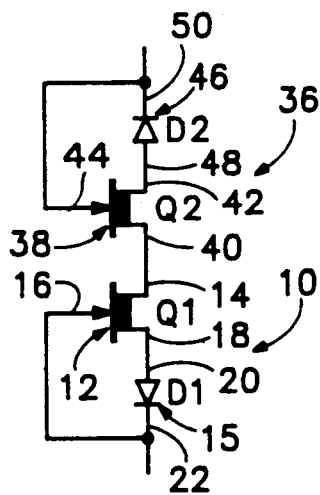
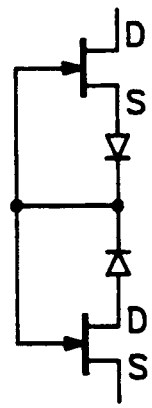
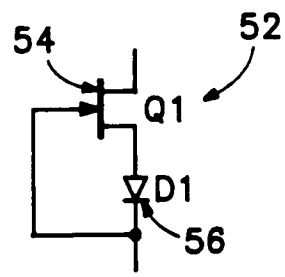
FIG.3　　FIG.3A　　FIG.4
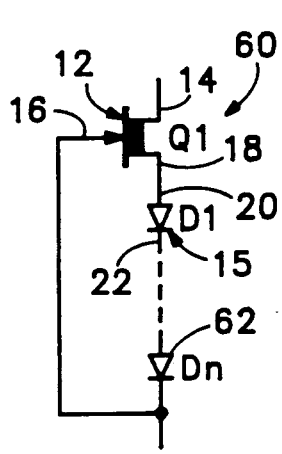
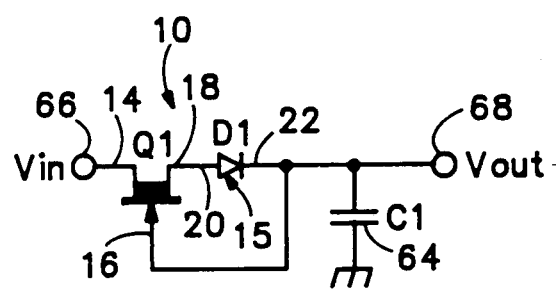
FIG.6
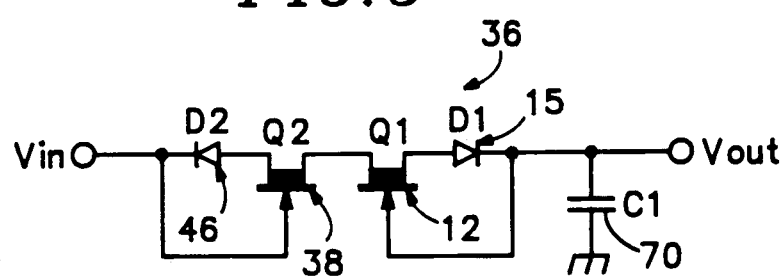
FIG.5　　FIG.7

HIGH-IMPEDANCE FET CIRCUIT

BACKGROUND OF THE INVENTION

1. Field of the Invention

The present invention relates to implementing high-impedance integrated circuit elements and more particularly to such elements having resistances of at least one megohm.

2. Description of the Related Art

In its simplest form, a low-pass filter comprises a resistor having first and second sides with the second side thereof being connected to ground via a capacitor. A signal is low-pass filtered by applying the same to the first side of the resistor. The filter output, i.e., the filtered signal, appears on the second side of the resistor. The time constant of the filter circuit, which is equal to the resistance of the resistor multiplied by the capacitance of the capacitor, determines which frequency components are passed by the filter and which are not. The greater the time constant, the lower the frequencies which are passed. Thus, when a filter which passes only very low frequencies is required, the filter time constant must be very large. A very large resistance or a very large capacitance must therefore be provided.

Using conventional integrated circuit designs for capacitors or resistors requires the use of large amounts of space in the circuit to provide either a large capacitor or a large resistor. For implementing a low-pass filter for a cut-off frequency of less than about 50 kilohertz, in order to use a conventionally-sized capacitor, the resistance must be in the one megohm range. A one megohm resistor implemented with conventional integrated circuit techniques would take up a tremendous amount of space.

Such filter circuits typically require resistances in the one megohm to one hundred megohm range. In many applications, e.g., certain low-pass filter applications, precise values of resistances are not necessary. So long as the resistance is sufficiently large, e.g., one megohm, circuit performance is satisfactory even if the resistance should be much larger, e.g., one hundred megohms, so long as it is not so large as to be, in effect, an open circuit. Some such applications for low-pass filters include, e.g., automatic gain control (AGC) circuits, DC control amplifiers, and other biasing circuits. In a similar way the resistive and capacitive elements can be interchanged to form a high-pass filter.

SUMMARY OF THE INVENTION

The present invention comprises a high impedance circuit element which includes a field-effect transistor (FET) having a gate, a source and a drain. The anode of a diode is electrically connected to the source while the cathode thereof is electrically connected to the FET gate. The diode biases the FET near the threshold of conduction when the drain is at a positive potential relative to the diode cathode thereby presenting a large impedance between the source and the drain. In another aspect of the invention, the diode also presents a large series impedance when its bias voltage is small.

It is a general object of the present invention to provide a high-impedance FET circuit which overcomes the above-enumerated disadvantages of prior art high-impedance circuits.

It is a more specific object of the present invention to bias a FET so as to produce a large, but not necessarily precise, resistance between the drain and the source thereof.

It is another specific object of the present invention to provide such a circuit which is especially suitable for implementing integrated circuit filters.

The foregoing and other objects, features and advantages of the invention will become more readily apparent from the following detailed description of a preferred embodiment which proceeds with reference to the drawings.

BRIEF DESCRIPTION OF THE DRAWINGS

FIGS. 1-5 each disclose different embodiments of FET circuits which present a high impedance between the input and output thereof.

FIGS. 6 and 7 illustrate low-pass filters implemented in accordance with the present invention.

DETAILED DESCRIPTION OF THE PREFERRED EMBODIMENT

Figure 8:
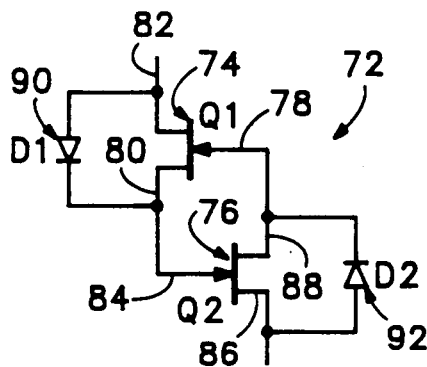
FIGS. 8 and 8A are additional embodiments for FET circuits which present a high impedance between the input and the output thereof.

Indicated generally at 10 in FIG. 1 is a circuit constructed in accordance with the present invention. Included therein is a field effect transistor 12 and a diode 15. Diode 15 includes an anode 20 and a cathode 22. Preferably circuit 10 is implemented as a GaAs MESFET, Si JFET, or Si MOSFET integrated circuit.

FET 12 includes a drain 14, a gate 16 and a source 18. The source and drain are so named to reflect the direction of current flow. Because FETs are symmetrical devices, the side which functions as a source when voltage of one polarity is applied functions as a drain when voltage of the opposite polarity is applied. The "source" and "drain" of each FET disclosed herein is therefore also referred to herein as a first side or as a second side to avoid confusion. The FET of FIG. 1 is an n-channel, depletion mode FET; however it should be appreciated that the invention can also be implemented with a p-channel FET and, as is later described herein, with an enhancement FET. If a p-channel FET is employed, the cathode of the diode is connected to the source of the FET and the anode of the diode to the gate of the FET.

Preferably FET 12 has a relatively long gate i.e., at least approximately five microns although the length of the gate may be larger, e.g., twenty microns and a narrow width, typically two or three microns. It is well known that FETs with relatively long gates present a higher impedance than FETs with shorter gates. As will later become apparent, this characteristic is preferred when implementing the present invention.

When the potential on drain 14 is positive relative to that appearing on cathode 22, the diode is forward biased by an amount dependent on the magnitude of the voltage on drain 14 and the FET and diode parameters. If the voltage on the drain is sufficiently large, diode 15 may conduct a small amount. In any event, with a positive voltage across diode 15, the gate-to-source voltage of the FET is reverse biased, keeping the FET almost cut off.

Figure 9:
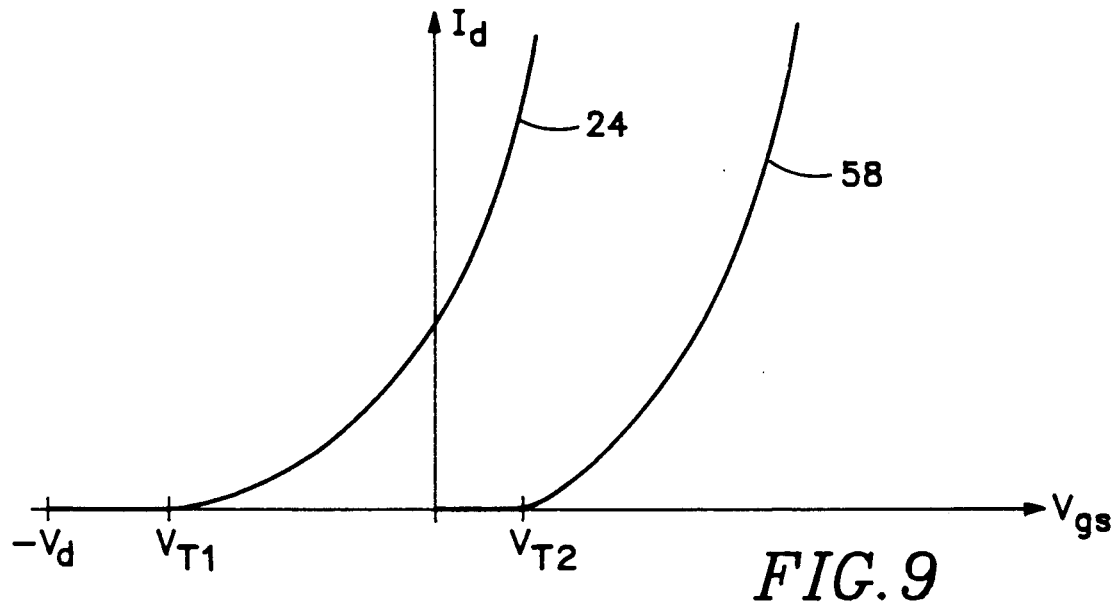
FIG. 9 is a plot of gate biasing voltage versus drain current for a depletion FET and for an enhancement FET.
Figure 9A:
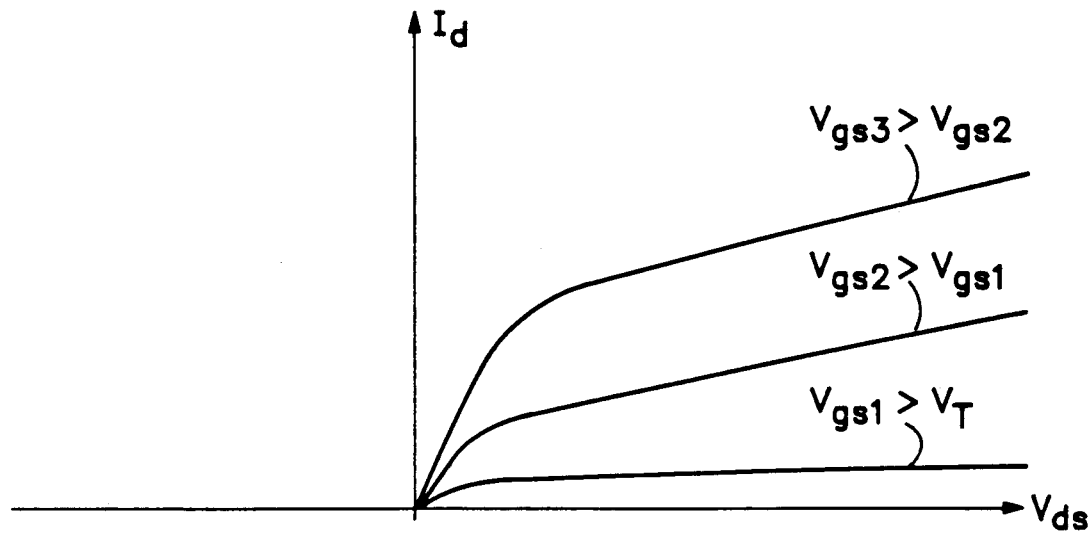
FIG. 9A is a plot of drain current versus drain-to-source voltage for different values of gate biasing voltage.

Turning to FIG. 9, a curve 24 is a plot of the drain current ($I_D$) as a function of gate bias ($V_{GS}$, the voltage between the gate and source of FET 12). As can be seen by examination of curve 24, the more negative $V_{GS}$ is, the smaller the drain current will be. Thus, the more voltage dropped across diode 15, the less current flows through FET 12. In FIG. 9, $|V_D|$ is the voltage across diode 15 when it is forward biased and $V_T$ is the threshold voltage for FET 12. Referring to FIG. 9, curve 24 shows a threshold voltage $V_{T1}$ that is less than zero for a normally on depletion device, and curve 58 shows a threshold voltage $V_{T2}$ that is greater than zero for a normally off enhancement device. FIG. 9A shows the drain current $I_D$ vs. $V_{DS}$ (drain-to-source voltage) for different values of $V_{GS}$ for a typical FET. The slope of $I_D$ vs. $V_{DS}$ represents the drain-to-source conductance (i.e., the reciprocal of the resistance) of the FET if $V_{GS}$ remains constant. From FIG. 9A it can be seen that for smaller values of $V_{GS}$ the slope of $I_D$ vs. $V_{DS}$ is smaller indicating that the drain-to-source resistance is large.

When $V_{GS}$ is greater than $V_T$, FET 12 is conducting and has a finite drain-to-source resistance. When $V_{GS}$ is sufficiently less than $V_T$ FET 12 is cut off and appears as an open circuit drain to source. The threshold voltage is the approximate voltage at which the FET begins to conduct. In the saturation region, $I_D$ increases exponentially when $V_{GS}$ is below $V_T$ and increases proportional to the square of $V_{GS}-V_T$ when $V_{GS}$ is greater than $V_T$. A FET is in the saturation region when $V_{DS}$ is sufficiently large so as to pinch the channel off or when the carriers in the channel reach a saturated maximum velocity. Preferably, the FET threshold voltage is comparable to the negative of the on-voltage of diode 15, although as will be further described hereinafter, the invention can be implemented when such is not the case.

It should be noted then in addition to biasing FET 12 toward a high impedance operating condition, the diode itself presents an increasing resistance when the voltage across and the current through the diode is small. Thus, for low positive voltages applied from drain 14 to cathode 22, the resistance of FET 12 may be relatively low since, at least for FET 12, such low voltages can cause $V_{GS}$ to be greater than $V_T$. However, when so operating, the resistance of the diode is relatively high. Assuming operation at room temperature and a voltage of 100 millivolts across the diode, the resistance of the diode is much greater than 10 megohms while the resistance between the source and drain of the FET may be far less.

Conversely, when large positive voltages are applied from drain 14 to cathode 22, diode 15 may be sufficiently forward biased so as to provide a relatively low resistance. FET 12, however, is biased to $V_{GS}$ equal $-V_D$ thus driving the FET into its sub-threshold, high-resistance operating range. Circuit 10 thus presents a high-resistance for both small and large positive voltages applied from drain 14 to cathode 22.

Turning now to FIG. 2, indicated generally at 26 is a circuit constructed in accordance with the present invention. The structure which corresponds to that previously described in FIG. 1 retains the same identifying numeral in FIG. 2. Circuit 26 includes a second n-channel depletion FET 28. FET 28 is substantially identical to FET 12 and includes a drain 30, a source 32 and a gate 34. In circuit 26, gate 34 is connected to anode 20 and source 32 is connected to drain 14.

It is known in the prior art for FETs to be connected for cascode operation. With reference to FIG. 2, the prior art cascode configuration would be as shown less diode 15 and with gate 34 of FET 28, source 18 of FET 12 and gate 16 of FET 12 all electrically connected to one another. When so operating, and with the potential of drain 30 positive relative to gates 16, 34 and source 18 (which are electrically connected to one another), FET 28 is said to cascode FET 12 thereby raising the output impedance of FET 12. Such cascode operation of FETs can increase the resistance across the circuit by a factor of about 10; however, biasing FET 12 in circuit 10 as described increases the FET resistance by a factor of 1,000 or more.

In circuit 26, biasing FET 12 with diode 15, as described in connection with circuit 10 in FIG. 1, cascodes FET 12 with FET 28 and increases the resistance between drain 30 and cathode 22 in circuit 26 to a value greater than that presented by circuit 10 alone.

In FIG. 2A, a version of the circuit of FIG. 2 is shown implemented with a pair of p-channel FETs. The source and drain of each FET are identified with the letters "S" and "D," respectively. The circuit of FIG. 2A achieves the same result as circuit 26 of FIG. 2, as will be readily understood by those having ordinary skill in the art.

A problem arises with the configuration of circuit 10 in that if the potential of drain 14 becomes negative relative to cathode 22, the p-n or Shottky diode between gate 16 and drain 14 is forward biased into a high-conduction condition thus substantially reducing the high impedance of circuit 10.

Indicated generally at 36 in FIG. 3 is a circuit constructed in accordance with the present invention that overcomes this problem. Incorporated therein is circuit 10 from FIG. 1, the elements of which retain the same numbers in FIG. 3. Circuit 36 comprises essentially symmetrical duplicates, relative to drain 14, of circuit 10. In addition to those components included in circuit 10, circuit 36 further includes a second FET 38 having a source 42, a drain 40 and a gate 44. A second diode 46 includes an anode 48, which is connected to source 42, and a cathode 50 tied to gate 44. Drain 40 of FET 38 is electrically connected to drain 14 of FET 12.

Circuit 36 presents an impedance greater than that of the circuit of FIG. 1. Circuit 36 also permits a signal which changes polarity to be applied thereacross (between cathode 50 and cathode 22) while maintaining a high impedance at all times, unlike circuit 10 in FIG. 1. As AC signal swings forward bias one of the gate-to-drain junctions contained in each FET, the other is always reversed biased thereby causing the circuit to present a high impedance for all polarities.

FIG. 3A illustrates a circuit which comprises symmetrical duplicates, relative to cathode 22, of circuit 10. It can be seen that for the circuit of FIG. 3A, when the polarity across the circuit is positive, the top FET and diode present a larger impedance than the bottom part of the circuit and vice versa. The circuit of FIG. 3A is thus electrically equivalent to circuit 36 in FIG. 3.

Turning now to FIG. 4, indicated therein is a circuit 52 which, like circuit 10, includes a FET 54 and a diode 56 connected in the same fashion as the FET and diode in circuit 10. FET 54 is, however, an enhancement FET. With reference again to FIG. 9, curve 58 is a plot of the drain current in FET 54 as a function of the voltage between the gate and source, $V_{GS}$, of FET 54. When FET 54 is in saturation, the gate-to-source voltage above which drain current varies proportional to the square of $V_{GS}-V_T$, the threshold voltage ($V_T$), is greater than zero. For $V_{GS}$ sufficiently less than $V_T$, FET 54 is in the sub-threshold region in which the drain current varies exponentially relative to $V_{GS}-V_T$.

Assuming diode 56 has the same voltage drop there-across as diode 15 when the diodes are conducting, enhancement FET 54 is driven even further into its sub-threshold conduction region by diode 56 than FET 12 is by diode 15. Dependent upon the value of $V_T$ and the operating characteristics depicted by curve 58, FET 54 may be biased very close to its cut off point thereby presenting an extremely large impedance.

Turning now to FIG. 5, components previously identified in circuit 10 retain the same number in the circuit, indicated generally at 60, in FIG. 5. Circuits 10 and 60 are substantially identical except that additional diodes, like diode 62, are placed in series with diode 15 with the cathode of diode 62 being tied to gate 16 as shown in FIG. 5. The additional voltage dropped across each additional diode biases the FET further toward its cut off point thereby increasing the impedance of circuit 60. Use of additional diodes also permits use of a depletion FET having a threshold voltage, $V_T$, the magnitude of which is greater than the on-voltage of a single diode. Thus, the impedance of the FET is further increased by adding additional biasing diodes. It is to be appreciated that additional diodes as shown in circuit 60 may be incorporated into circuits of FIGS. 2-4 with the same effect.

The circuits of FIGS. 2, 4 and 5 can be placed back-to-back, as was done with circuit 10 to produce circuit 36 in FIG. 3, in order to handle large input signals including those with varying polarity.

In FIG. 6, circuit 10 is utilized in combination with a capacitor 64 to form a low-pass filter circuit having an input terminal 66 and an output terminal 68. In FIG. 7, circuit 36 is utilized in combination with a capacitor 70 to provide a low-pass filter having an even higher impedance. Conventional integrated circuit techniques are used to form the filters of FIGS. 6 and 7 which each take up a relatively small or moderate amount of die area. The filter of FIG. 7 can accommodate an input signal having varying polarity as previously described in connection with the operation of circuit 36.

The high impedance circuit elements and capacitors in FIGS. 6 and 7 can be interchanged to form a high pass filter.

Turning now to FIG. 8, indicated generally at 72 is a circuit constructed in accordance with the present invention. Included therein are a pair of enhancement FETs 74, 76 connected as shown. FET 74 includes a gate 78, a source 80 and a drain 82. FET 76 includes a gate 84, a source 86 and a drain 88. Shunt diodes 90, 92 are connected across FETs 74, 76, respectively, but are not essential to operation of circuit 72 under all circumstances, as is hereinafter described.

Circuit 72 is essentially a symmetrical version of circuit 52 in FIG. 4. In FIG. 8, if drain 82 of FET 74 is positive and source 86 of FET 76 is at a lower potential, the gate 84-source 86 junction will have a small forward bias. This drives the FET into a relatively low impedance mode, i.e., the drain 88-source 86 resistance is relatively low. The potential of gate 78 of FET 74 is therefore at substantially the same potential as source 86 of FET 76. The gate 84-source 86 junction of FET 76 thus behaves in the same way as diode 56 in circuit 52 in FIG. 4. Since the circuit in FIG. 8 is symmetrical, the same result holds when a voltage of an opposite polarity is applied. In this case, because FETs are symmetrical devices, the source and drain of each FET have reversed functions. Thus, the objective of circuit 36 in FIG. 3 is achieved, i.e., high impedance is present for either polarity.

Circuit 72 in FIG. 8 achieves an advantage over that of circuit 36 in FIG. 3. Circuit 36 effectively consists of two forward biased diodes in series with the impedance of one FET. For example, when cathode 50 is positive relative to cathode 22, voltage is dropped across the forward-biased gate 44-drain 40 junction of FET 38, across FET 12 and across diode 15. When cathode 22 is positive relative to cathode 50, voltage is dropped across the forward-biased gate 16-drain 14 junction, across FET 38 and across diode 46. FIG. 8, however, essentially consists of one forward-biased diode in series with the impedance of a FET. When drain 82 is high relative to source 86, voltage is dropped across the high impedance of FET 74 and across the forward-biased gate 84-source 86 junction of FET 76. When the polarity of the applied signal is reversed, FET 76 is a high impedance with additional voltage being dropped across the forward-biased gate 78-source 82 (previously identified as drain 62 but now functioning as the source) junction of FET 74. If a small direct current flows through the high impedance circuit, the resulting voltage drop is smaller with one diode, as is the case for circuit 72 of FIG. 8, rather than with two diodes as in circuit 36 of FIG. 3. If the high impedance circuit drops an excessive voltage, the bias point of associated circuitry may be shifted. The choice of enhancement FETs in circuit 72 results in substantially high impedance because the enhancement FETs operate in the subthreshold conduction region, in the same fashion as described in connection with circuit 52 in FIG. 4. Optional diodes 90, 92 provide a shunt path around FETs 74, 76 for large voltage swings or in case the FETs are completely cut off. Conduction may occur in the diodes prior to steady state circuit operation but under normal conditions diodes 90, 92 do not conduct. For larger AC signals, diodes 90,92 may each be replaced by two or more diodes if necessary.

Figure 8A:
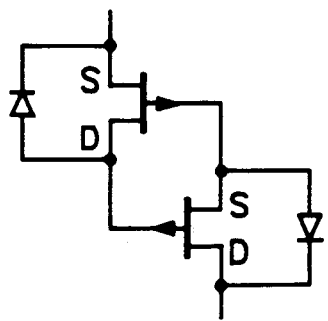

FIG. 8A illustrates circuit 72 of FIG. 8A implemented with p-channel FETs. The FIG. 8A circuit achieves the same result as circuit 72, i.e., high impedance is presented regardless of the polarity of the voltage applied across the circuit.

Figure 10:
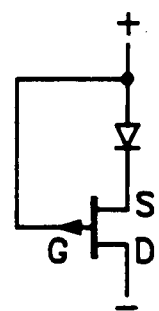

It is apparent that embodiments equivalent to those n-channel circuits illustrated herein can be implemented in p-channel form and some such p-channel implementations are also disclosed. As can be seen by comparing the embodiments of FIG. 1 and FIG. 10, the polarity of the biasing diode changes depending upon whether the circuit is implemented in p-channel or n-channel form but the circuits are functional equivalents to one another.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

We claim:

1. A high impedance integrated circuit element comprising:

an n-channel FET having a gate, a first side and a second side;

a diode having an anode and a cathode, said anode being electrically connected to said first side and said cathode being electrically connected to said gate, said diode biasing said FET to reduce FET conduction when said second side is at a positive potential relative to said diode cathode; and a second FET having a gate, a first side and a second side and wherein the gate of said second FET is electrically connected to said anode and the first side of said second FET is electrically connected to the second side of said first FET.

2. A high impedance integrated circuit element comprising:

an n-channel FET having a gate, a first side and a second side;

a diode having an anode and a cathode, said anode being electrically connected to said first side and said cathode being electrically connected to said gate, said diode biasing said FET to reduce FET conduction when said second side is at a positive potential relative to said diode cathode;

a second n-channel FET having a gate, a first side and a second side, the second side of said second FET being connected to the second side of said first FET; and a second diode having an anode and a cathode, the anode of said second diode being connected to the first side of said second FET and the cathode of said diode being connected to the gate of said second FET, said second diode biasing said second FET to reduce FET conduction in said second FET when the first side of said second FET is at a negative potential relative to the second side of said second FET thereby permitting said element to present a high impedance regardless of the polarity of the voltage applied across the element.

3. A high pass filter integrated circuit comprising:

an n-channel FET having a gate, a first side and a second side;

a diode having an anode and a cathode, said anode being electrically connected to said first side and said cathode being electrically connected to said gate, said diode biasing said FET to reduce FET conduction when said second side is at a positive potential relative to said diode cathode, said cathode being electrically connected to a preselected electrical potential; and a capacitor having one end electrically connected to said second side.

4. The circuit element of claim 2 wherein said circuit element comprises a low-pass filter and wherein said circuit element further comprises a capacitor having one end electrically connected to said cathode and the other end electrically connected to a preselected electrical potential.

5. A high impedance circuit element comprising:

a first n-channel FET having a gate, a first side and a second side; and a second n-channel FET having a gate, a first side and a second side, the first side of said second FET being connected to the gate of said first FET and the second side of said first FET being connected to the gate of said second FET, the gate-to-first-side junction of said first FET biasing said second FET to reduce the conduction therein when the second side of said second FET is at a positive potential relative to the first side of said first FET and the gate-to-second-side junction of said second FET biasing said first FET to reduce second side current therein when the first side of said first FET is at a positive potential relative the second side of said second FET thereby permitting said element to present a high impedance regardless of the polarity of the voltage applied across the element.

6. The circuit element of claim 5 wherein said element is implemented in integrated form.

7. The circuit element of claim 6 wherein said circuit element further includes:

a first diode having an anode and a cathode, said anode being connected to the second side of said second FET and said cathode being connected to the first side of said second FET; and a second diode having an anode and a cathode, the anode of said second diode being connected to the first side of said first FET and the cathode of said second diode being connected to the second side of said first FET.

8. The circuit element of claim 7 wherein said circuit element further includes a plurality of sequential diodes disposed in anode-to-cathode relationship between the first and second sides of said second FET, the first diode in said sequence having the anode thereof connected to the second side of said second FET and the last diode in said sequence having the cathode thereof connected to the first side of said second FET.

9. The circuit element of claim 7 wherein said circuit element further includes a plurality of sequential diodes disposed in anode-to-cathode relationship between the first and second sides of said first FET, the first diode in said sequence having the anode thereof connected to the first side of said first FET and the last diode in said sequence having the cathode thereof connected to the second side of said first FET.

10. A high impedance circuit element comprising:

a first p-channel, FET having a gate, a first side and a second side; and a second p-channel, FET having a gate, a first side and a second side, the first side of said second FET being connected to the gate of said first FET and the second side of said first FET being connected to the gate of said second FET, the gate-to-first side junction of said first FET biasing said second FET to reduce the conduction therein when the second side of said second FET is at a negative potential relative to the first side of said first FET and the gate-to-second side junction of said second FET biasing said first FET to reduce second side current therein when the first side of said first FET is at a negative potential relative the second side of said second FET thereby permitting said element to present a high impedance regardless of the polarity of the voltage applied across the element.

11. A method for providing a high impedance in an integrated circuit comprising the steps of:

providing a FET in series with a diode;

biasing the FET to reduce conduction therethrough, said biasing comprising the steps of:

electrically connecting one end of said diode to one side of said FET and the other end of said diode to the gate of said FET;

applying a signal across said other end of said diode and the other side of said FET; and maintaining the voltage between the gate and source of said FET at a level which drives said FET into a sub-threshold, high-resistance operating range.

12. The method of claim 11 wherein said FET is an n-channel FET and wherein the step of electrically connecting said diode to said FET further comprises the step of connecting the anode of said diode to one side of said FET and connecting the cathode of said diode to said gate.

13. The method of claim 12 wherein the step of applying a voltage across said other end of said diode and the other side of said FET comprises the step of applying a positive voltage between the other side of said FET and the cathode of said diode.

14. A method for providing a high impedance in an integrated circuit comprising the steps of:
providing a p-channel FET in series with a diode; and
biasing the FET to reduce conduction therethrough, said biasing comprising the steps of:
connecting the cathode of said diode to one side of said FET and connecting the anode of said diode to said gate; and
applying a voltage across said other end of said diode and the other side of said FET.

15. The method of claim 14 wherein the step of applying a voltage across said other end of said diode and the other side of said FET comprises the step of applying a positive voltage between the anode of said diode and the other side of said FET.

16. The high impedance circuit element of claim 5 wherein said first and second FETs are enhancement FETs.

17. The high impedance circuit element of claim 10 wherein said first and second FETs are enhancement FETs.

18. The circuit element of claim 10 wherein said element is implemented in integrated form.

19. The circuit element of claim 18 wherein said circuit element further includes:
a first diode having an anode and a cathode, said anode being connected to the second side of said second FET and said cathode being connected to the first side of said second FET; and
a second diode having an anode and a cathode, the anode of said second diode being connected to the first side of said first FET and the cathode of said second diode being connected to the second side of said first FET.

20. The circuit element of claim 19 wherein said circuit element further includes a plurality of sequential diodes disposed in anode-to-cathode relationship between the first and second sides of said second FET, the first diode in said sequence having the anode thereof connected to the first side of said second FET and the last diode in said sequence having the cathode thereof connected to the second side of said second FET.

21. The circuit element of claim 19 wherein said circuit element further includes a plurality of sequential diodes disposed in anode-to-cathode relationship between the first and second sides of said first FET, the first diode in said sequence having the anode thereof connected to the second side of said first FET and the last diode in said sequence having the cathode thereof connected to the first side of said first FET.

22. The method of claim 11 wherein said method further includes the step of maintaining the voltage between the anode and cathode of said diode at a level which prevents diode conduction for all values of said signal sufficient to turn the FET on.

23. The method of claim 11 wherein said method further includes the step of providing a second diode in series with said first diode and in anode-to-cathode relation therewith.

24. The circuit element of claim 1 wherein said FETs are depletion-mode FETs.

25. The circuit element of claim 1 wherein said FETs are enhancement-mode FETs.

26. The circuit element of claim 1 wherein the length of said FET gate is at least 5 microns.

27. The circuit element of claim 1 wherein the width of said FET gate is less than 3 microns.

28. The circuit element of claim 2 wherein said FETs are depletion-mode FETs.

29. The circuit element of claim 2 wherein said FETs are enhancement-mode FETs.

30. The circuit element of claim 2 wherein the length of said FET gate is at least 5 microns.

31. The circuit element of claim 2 wherein the width of said FET gate is less than 3 microns.

* * * * *